United States Patent
Park

(10) Patent No.: US 8,388,162 B2
(45) Date of Patent: Mar. 5, 2013

(54) LIGHT SOURCE DEVICE AND DISPLAY DEVICE HAVING THE SAME

(75) Inventor: Jun Seok Park, Gwangju-si (KR)

(73) Assignee: LG Innotek Co., Ltd., Seoul (KR)

( * ) Notice: Subject to any disclaimer, the term of this patent is extended or adjusted under 35 U.S.C. 154(b) by 275 days.

(21) Appl. No.: 12/375,485

(22) PCT Filed: Apr. 15, 2008

(86) PCT No.: PCT/KR2008/002121
§ 371 (c)(1),
(2), (4) Date: Jan. 28, 2009

(87) PCT Pub. No.: WO2008/127064
PCT Pub. Date: Oct. 23, 2008

(65) Prior Publication Data
US 2009/0310335 A1  Dec. 17, 2009

(30) Foreign Application Priority Data

Apr. 16, 2007 (KR) .................. 10-2007-0036855

(51) Int. Cl.
*F21S 4/00* (2006.01)
(52) U.S. Cl. ............... 362/97.3; 362/800; 362/249.02
(58) Field of Classification Search .............. 362/97.1, 362/97.2, 97.3, 249.02
See application file for complete search history.

(56) References Cited

U.S. PATENT DOCUMENTS

| 5,559,681 | A * | 9/1996 | Duarte | 362/231 |
| 6,422,716 | B2 * | 7/2002 | Henrici et al. | 362/235 |
| 7,350,937 | B2 * | 4/2008 | Yamamoto et al. | 362/249.01 |
| 7,553,162 | B2 * | 6/2009 | Isoda et al. | 439/56 |
| 7,744,264 | B2 * | 6/2010 | Tsao et al. | 362/631 |
| 2003/0112627 | A1 * | 6/2003 | Deese | 362/249 |
| 2005/0265051 | A1 | 12/2005 | Yamamoto et al. | |
| 2006/0092346 | A1 | 5/2006 | Moon et al. | |
| 2006/0289201 | A1 * | 12/2006 | Kim et al. | 174/261 |
| 2007/0115662 | A1 * | 5/2007 | Roberts et al. | 362/252 |
| 2007/0115670 | A1 * | 5/2007 | Roberts et al. | 362/367 |
| 2007/0115671 | A1 * | 5/2007 | Roberts et al. | 362/367 |
| 2009/0002988 | A1 * | 1/2009 | Kim et al. | 362/247 |
| 2009/0009997 | A1 * | 1/2009 | Sanfilippo et al. | 362/244 |

FOREIGN PATENT DOCUMENTS

| JP | 2006-079946 A | 3/2006 |
| JP | 2006-228529 A | 8/2006 |
| KR | 10-2005-0099659 A | 10/2005 |
| KR | 10-2006-0046148 A | 5/2006 |
| KR | 10-2006-0135203 A | 12/2006 |

* cited by examiner

Primary Examiner — Jong-Suk (James) Lee
Assistant Examiner — Leah S Macchiarolo
(74) Attorney, Agent, or Firm — Birch, Stewart, Kolasch & Birch, LLP

(57) ABSTRACT

Disclosed are a light source device and a display device having the same. The light source device comprises light emitting modules comprising a light emitting device, a circuit termination module provided at a second end of the light emitting module, first and second connectors connected to a first end and the second end of the light emitting modules, respectively, and a fourth connector connected to the circuit termination module, and connected to the second connector of the light emitting module.

21 Claims, 10 Drawing Sheets

LIGHT SOURCE DEVICE AND DISPLAY DEVICE HAVING THE SAME

TECHNICAL FIELD

The embodiment relates to a light source and a display device having the same.

BACKGROUND ART

Display apparatuses include a cathode ray tube (CRT), a liquid crystal display (LCD) using an electro-optic effect, a plasma display panel (PDP) using a gas-discharge effect, and an electro luminescence display (ELD) using an electro-luminescence effect. Among the display apparatuses, the study on the LCD has been actively performed.

Since the LCD is advantageous in terms of miniaturization, weight, low power consumption, full color implementation and the like, the LCD can overcome the disadvantages of a CRT. Accordingly, the LCD has been widely used for various fields.

Since such an LCD is a light receiving device that displays an image by adjusting the amount of light from the outside, the LCD requires an additional external light source such as a backlight unit.

DISCLOSURE OF INVENTION

Technical Problem

The embodiments provide a light source device and a display device having the same, capable of connecting light emitting modules to each other by using connectors.

The embodiments provide a light source device and a display device having the same, capable of connecting light emitting modules to a circuit termination module by using connectors.

The embodiments provide a light source device and a display device having the same, capable of connecting light emitting modules to an external connection module by using connectors.

The embodiments provide a light source device and a display device having the same, capable of connecting the array of light emitting modules provided in a plurality of rows to one circuit termination module.

The embodiments provide a light source device and a display device having the same, capable of connecting the array of light emitting module provided in a plurality of rows to one external connection module.

The embodiments provide a light source device and a display device having the same, capable of connecting light emitting modules, a circuit termination module, and an external connection module to each other by using connectors.

Technical Solution

The embodiment provides a light source device comprising; light emitting modules comprising a light emitting device, a circuit termination module provided at a second end of the light emitting module, first and second connectors connected to a first end and the second end of the light emitting modules, respectively, and a fourth connector connected to the circuit termination module, and connected to the second connector of the light emitting module.

The embodiment provides a light source device comprising; a light emitting module array, in which light emitting modules comprising a light emitting device are provided in a plurality of rows, a circuit termination module provided at a second end of the light emitting module array, first and second connectors connected to both end portions of the light emitting module, in which the first and second connectors connect the light emitting modules provided in each row to each other, and a plurality of fourth connectors connected to the circuit termination module, in which each fourth connector is connected to the second connector of the light emitting module provided at a final stage of each row.

The embodiment provides a display device comprising; a plurality of light emitting modules comprising a light emitting device, a bottom cover below the plural light emitting modules, an external connection module provided at a first end of the plural light emitting modules, a circuit termination module provided at a second end of the plural light emitting modules, first and second connectors electrically connected to the first and second ends of the light emitting module, in which the first and second connectors connect the light emitting modules to each other, and a fourth connector connected to the circuit termination module, and connected to the second connector of the light emitting module provided at a final stage.

Advantageous Effects

According to the embodiments, modules of a light source device are connected to each other by using connectors, so that the modules can be stably connected.

According to the embodiments, connectors are provided at the bottom surface of a light emitting module, so that space utilization can be improved at the top surface of the light emitting module.

According to the embodiments, modules are connected to each other by using connectors comprising a hook structure, so that the connection force between the modules is improved. Accordingly, the connection between the modules is strong against vibration or shock.

According to the embodiments, light emitting modules provided in at least one row are connected to a circuit termination module by using a connector, so that there is no need to form an additional pattern on the other end of the light emitting module.

According to the embodiments, light emitting modules provided in at least one row are connected to an external connection module by using a connector, so that there is no need to form an additional pattern on one end of the light emitting module.

According to the embodiments, auxiliary modules are provided at both sides of the light emitting module, so that light emitting modules having the same type can be used. Accordingly, the light emitting module can be conveniently manufactured.

According to the embodiments, a light emitting module can be easily replaced with new one.

BEST MODE FOR CARRYING OUT THE INVENTION

Hereinafter, the embodiments will be described with reference to accompanying drawings.

Figure 1:
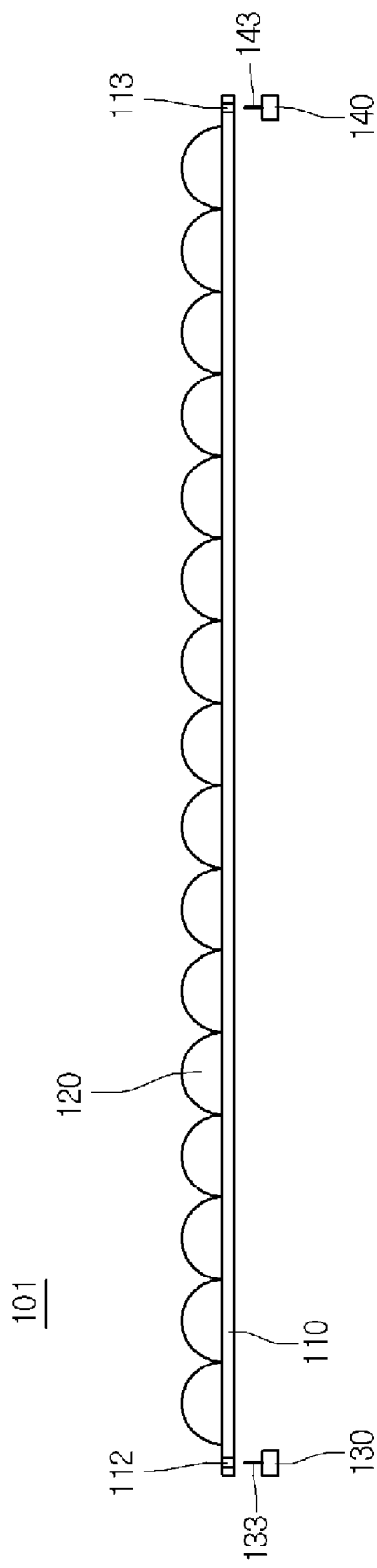
FIG. 1 is a side view showing a light emitting module according to the embodiment.
Figure 2:
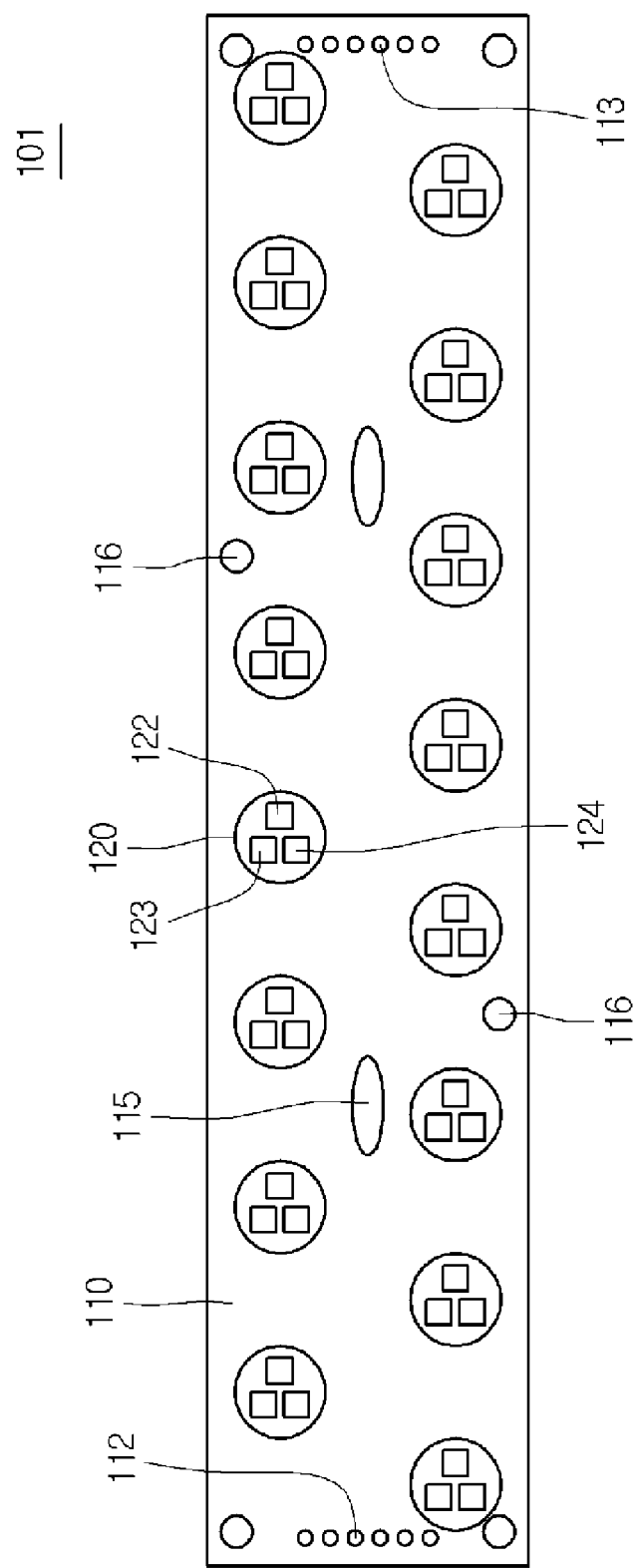
FIG. 2 is a plan view of FIG. 1.

FIG. 1 is a sectional view showing a light source device according to the embodiment, and FIG. 2 is a plan view of FIG. 1.

Referring to FIGS. 1 and 2, a light emitting module 101 comprises a substrate 110 and light emitting devices 120. The substrate 110 can be realized as a single layer substrate or a multi-layer substrate by using resin- or ceramic-based materials such as FR-4 or composite epoxy materials grade 3 (CEM-3).

As shown in FIG. 2, the substrate 110 comprises a screw coupling hole 116 and a guide hole 115.

The substrate 110 is fixed by coupling a screw into the screw coupling hole 116. A guide protrusion (not shown) may be inserted into the guide hole 115 to maintain the distance from the light emitting module 101. The substrate 110 may not comprise the screw coupling hole 116 or the guide hole 115, and the embodiment is not limited thereto.

The substrate 110 is formed at both ends thereof with pin holes 112 and 113. The pin holes 112 and 113 comprise a via hole or a through hole, and the substrate 110 may be connected to chip interconnections of the light emitting device 120 through the pin holes 112 and 113. For example, one LED chip requires two electrode terminals, and three kinds of LED chips require six electrode terminals. The number of the pin holes 112 and 113 corresponds to the electrode terminals of three kinds of LED chips. The number of the pin holes 112 and 113 may be changed according to the type or the driving scheme of the LED chips.

The pin holes 112 and 113 of the substrate 110 correspond to pins 133 and 143 of connectors 130 and 140. The pins 133 and 143 of the connectors 130 and 140 are inserted into the pin holes 112 and 113 at the lower portion of the substrate 110, so that the connector 130 and 140 are electrically connected to an interconnection pattern of the substrate 110. In other words, the pin 133 of the first connector 130 can be inserted into the first pin hole 112 of the substrate 110, and the pin 143 of the second connector 140 can be inserted into the second pin hole 113 of the substrate 110.

As shown in FIG. 2, the light emitting device 120 comprises at least one of LED chip. The LED chip comprise at least one of a red LED chip, a green LED chip, a blue LED chip, a yellow LED chip, and an UV LED chip. Three kinds of LED chips 122, 123 and 124 such as a red LED chip, a green LED chip, and a blue LED chip are clustered on the light emitting device 120 according to the embodiment. The type or the number of the LED chip of the light emitting device 120 may be changed.

In addition, the light emitting device 120 may be prepared by selectively combining various color LED chips 122, 123 and 124 and various phosphors. Hereinafter, the light emitting device 120 comprising red, green, and blue LED chips 122, 123 and 124 will be described.

Such light emitting devices 120 may be provided on the substrate 110 in one row or two rows. When the light emitting devices 120 are provided in two rows, the light emitting devices 120 may be provided in the form of a zigzag.

The first and second connectors 130 and 140 are mounted on both ends of the light emitting module 101 so that the light emitting module 101 may be connected to other modules. Accordingly, the connection structure between modules can be simply provided. In addition, the first and second connectors 130 and 140 are provided on the bottom surface of the light emitting module 101, thereby ensuring the sufficient space on the top surface of the substrate.

Figure 3:
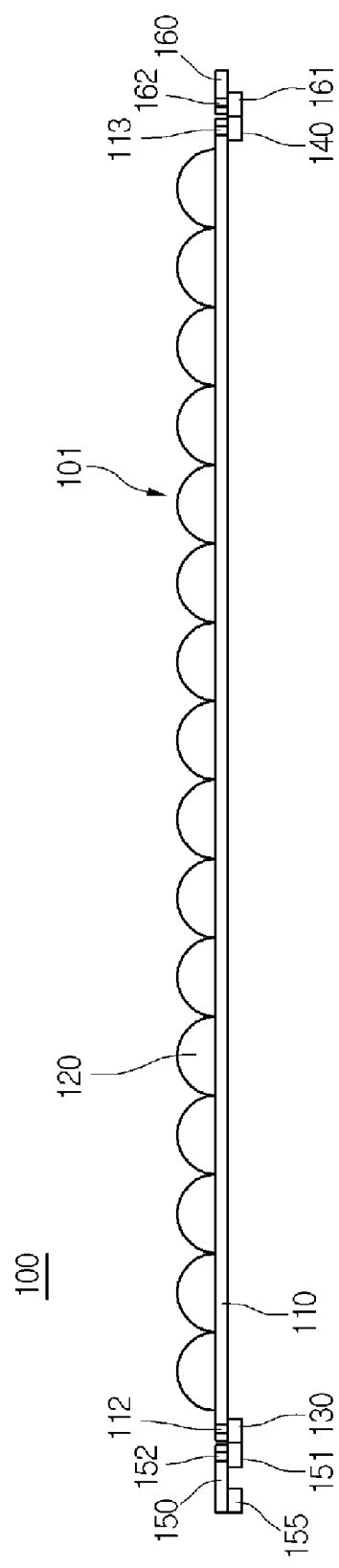
FIG. 3 is a side view showing a light source device employing the light emitting module of FIG. 1 according to a first embodiment.
Figure 4:
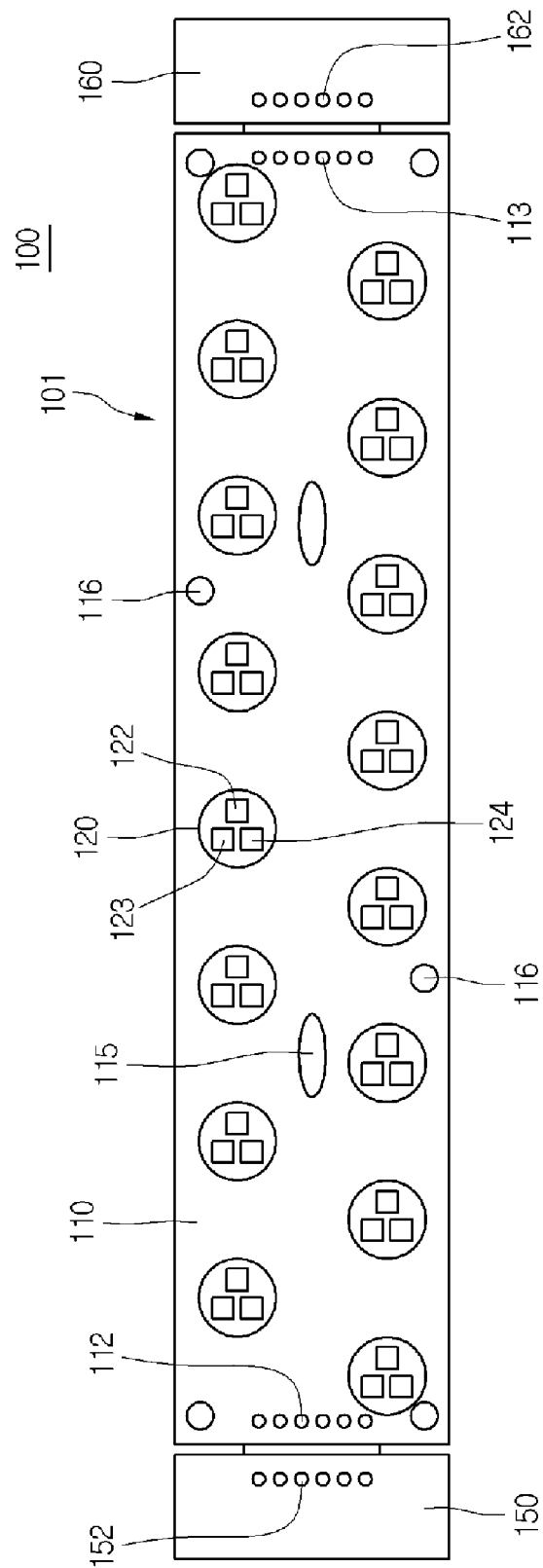
FIG. 4 is a plan view of FIG. 3.

FIG. 3 is a side view showing a light source device 100 employing the light emitting module 101 of FIG. 1 according to the first embodiment, and FIG. 4 is a plan view of FIG. 3.

Referring to FIGS. 3 and 4, the light source device 100 comprises the light emitting module 101, an external connection module 150, a circuit termination module 160, the first connector 130, the second connector 140, and third to fifth connectors 151, 161 and 155.

The light emitting module 101 is provided at a first side thereof with the external connection module 150, and at a second side thereof with the circuit termination module 160.

The external connection module 150 is formed at a first end thereof with a plurality of pin holes 152, and pins of the third connector 151 are inserted into the pin holes 152. The third connector 151 of the external connection module 150 corresponds to the first connector 130 of the light emitting module 101, and the third connector 151 is connected to the first connector 130 through a male/female connection scheme. A second end of the external connection module 150 is connected to the fifth connector 155, and the fifth connector 155 is connected to a driver (not shown).

The circuit termination module 160 is formed at a first end thereof with pin holes 162, and the pins of the fourth connector 161 are inserted into the pin holes 162. The fourth connector 161 of the circuit termination module 160 corresponds to the second connector 140 of the light emitting module 101, and the fourth connector 161 is connected to the second connector 140 through a male/female connection scheme.

The first to fourth connectors 130, 140, 151, and 161 are mounted on the bottom surface of the light emitting module 101, the external connection module 150, and the circuit termination module 160.

The first and fourth connectors 130 and 161 may be a female connector or a female socket, that is, they may have the same structure, and the second and third connectors 140 and 151 may be a male connector or a male socket, that is, they may have the same structure. The first and fourth connectors 130 and 161 may have a male/female connection structure corresponding to the second and third connectors 151. The first to fourth connectors 130, 140, 151, and 161 are connected to the modules 101, 150 and 160 through a pin connection scheme, and connected to other modules through a connector connection scheme.

The first connector 130 of the light emitting module 101 is connected to the third connector 151 of the external connection module 150, and the second connector 140 of the light emitting module 101 is connected to the fourth connector 161 of the circuit termination module 160.

Accordingly, current applied to the external connection module 150 drives the LED chips 122, 123 and 124 of the light emitting module 101. The current flows to the external connection module 150, which is electrically connected to the light emitting module 101 through the circuit termination module 160, by reversely flowing through the light emitting module 101. In such a manner, the LED chips 122, 123 and 124 mounted on the light emitting module 101 can be individually controlled according to colors thereof.

Figure 5:
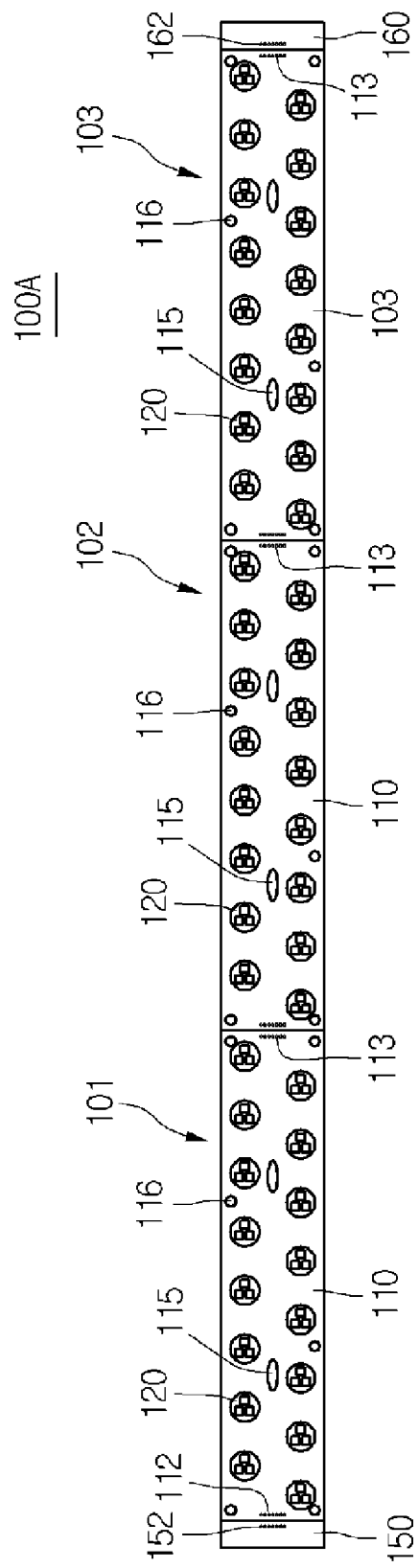
FIG. 5 is a plan view showing a light source device employing a light emitting module of FIG. 1 according to a second embodiment.
Figure 6:
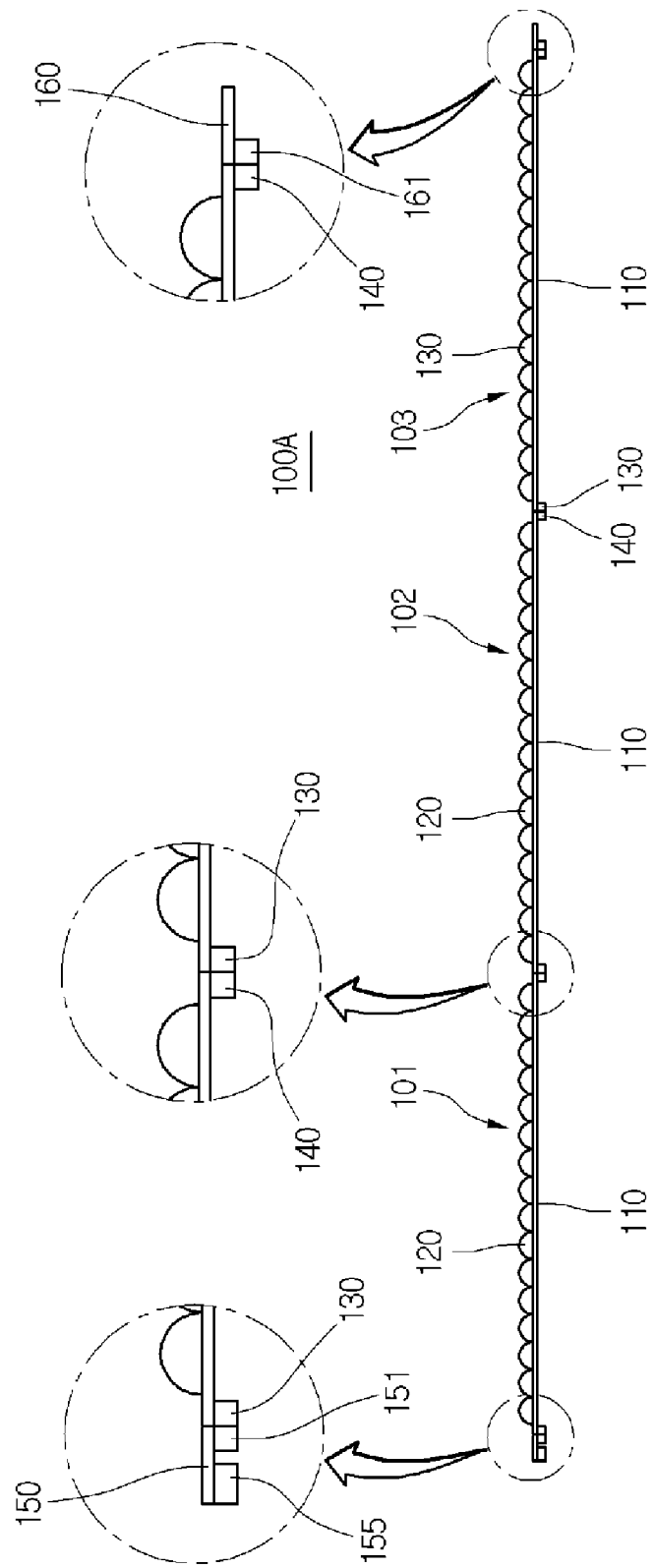
FIG. 6 is a side view of FIG. 5.

FIG. 5 is a plan view showing a light source device 100A employing the light emitting module 101 of FIG. 1 according to a second embodiment, and FIG. 6 is a side view of FIG. 5.

Referring to FIGS. 5 and 6, the light source device 100A comprises a plurality of light emitting modules 101, 102, and 103, an external connection module 150, a circuit termination module 160, first to fourth connectors 130 140, 151, and 161, and a fifth connector 155.

The light emitting modules 101, 102, and 103 are arrayed in one direction. The light emitting modules 101, 102, and 103 are connected to each other by the first and second connectors 130 and 140. In other words, the second connector 140 of the first light emitting module 101 is connected to the first connector 130 of the second light emitting module 102, and the second connector 140 of the second light emitting module 102 is connected to the first connector 130 of the third light emitting module 103. The above plural light emitting modules 101, 102, and 103 are horizontally and/or vertically connected to each other in series or in parallel by using the connectors 130 and 140.

The third connector 151 of the external connection module 150 may be connected to the first connector 130 of the first light emitting module 101 provided at a starting stage of the light source device 110A, and the fifth connector 155 may be connected to a driver (not shown).

The fourth connector 161 of the circuit termination module 160 is connected to the second connector 140 of the third light emitting module 103 provided at a final stage of the light source module 110A, thereby providing a closed loop or a feed-back loop.

The light emitting modules 101, 102, and 103, the external connection module 150, and the circuit termination module 160 are connected to each other by using connectors, so that it is possible for a user to conveniently connect modules among each other and replace the light emitting modules 101, 102, and 103 with new ones.

According to the embodiment, the external light emitting module 150 and the circuit termination module 160 provided at both ends of the array of the light emitting modules are electrically connected to each other, so that the light emitting modules 101, 102, and 103 comprising the same interconnection patterns can be manufactured.

In addition, the first to fourth connectors 130, 140, 151 and 161 are prepared in the type of a female connector and a male connector, so that the first to fourth connectors 130, 140, 151, and 161 can be stably connected to each other.

Figure 7:
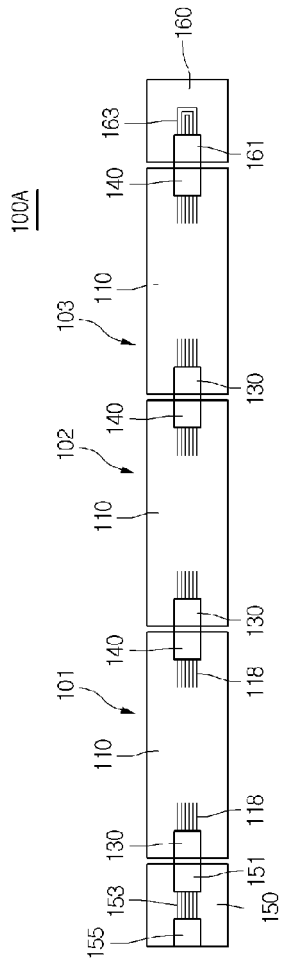
FIG. 7 is a rear view of FIG. 5.

FIG. 7 is a rear view of FIG. 5.

Referring to FIG. 7, lead patterns 118, 153, and 163 connected to the pin holes can be formed at the bottom surfaces of the light emitting modules 101, 102, and 103, the external connection module 150, and the circuit termination module 160. The lead patterns 118, 153, and 163 can improve the electrical connection with the connectors 130, 140, 151, and 161.

The lead pattern 153 of the external connection module 150 can connect the third connector 151 with the fifth connector 155.

The lead pattern 163 of the circuit termination module 160 is formed in the closed loop pattern or the feed-back loop pattern to connect the same kind of pins of the fourth connector 161 to each other in series.

Figure 8:
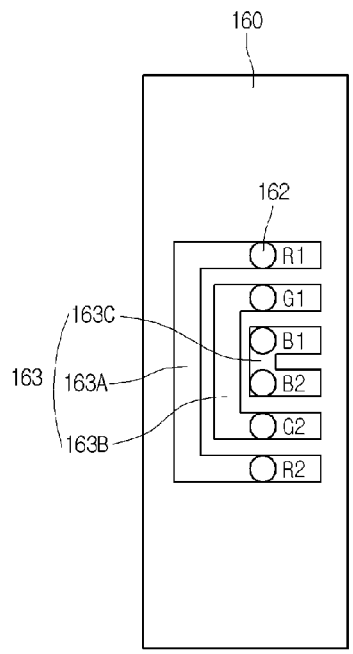
FIG. 8 is a rear view showing an external connection module according to the embodiment.

FIG. 8 is a rear view showing the external connection module 150 according to the embodiment.

Referring to FIG. 8, pin holes 162 are formed on sub-lead patterns 163A, 163B, and 163C of the lead pattern 163 of the circuit termination module 160, and the pins of the fourth connector 161 are inserted into the pin holes 162.

The sub-lead patterns 163A, 163B, and 163C of the lead pattern 163 are formed in a closed loop or a feed-back loop pattern, so that the first sub-lead pattern 163A connects terminals R1 and R2 of a red LED chip to each other in series, the second sub-lead pattern 163B connects terminals G1 and G2 of a green LED chip to each other in series, and the third sub-lead pattern 163C of the connects terminals B1 and B2 of a blue LED chip to each other in series. In this case, the terminals R1, G1, and B1 may serve as positive terminals or negative terminals of the three kinds of LED chips. The terminals R2, G2, and B2 are connected to the terminals R1, G1, and B1 of the LED chips in series, and fed back in a reverse path.

An external connector may be provided at the lead pattern 163 of such a circuit termination module 160. In this case, the lead pattern 163 of the circuit termination module 160 must be connected to the driver through a cable.

Figure 9:
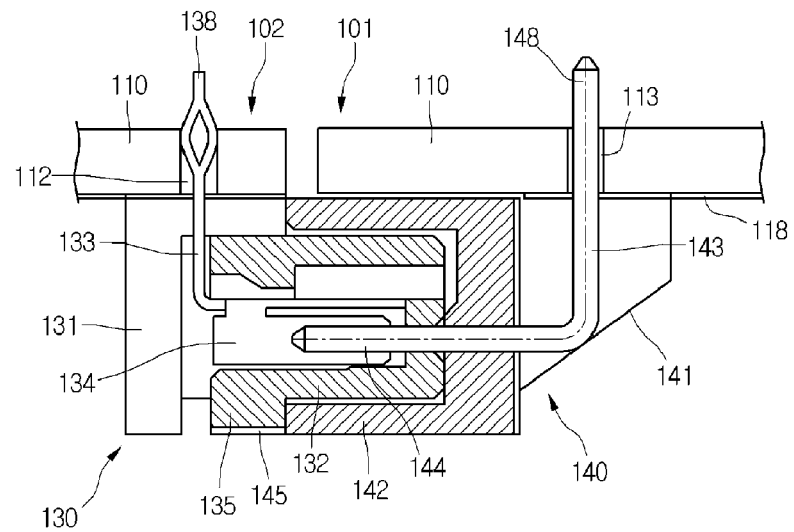
FIG. 9 is a sectional view showing the connection state of a first connector and a second connector according to the embodiment.

FIG. 9 is a sectional view showing the connection state of the first and second connectors according to the embodiment. In this case, the first connector 130 has the same structure as that of the fourth connector, and the second connector 140 has the same structure as that of the third connector. Accordingly, details of the third and fourth connectors will be omitted.

Referring to FIG. 9, the first connector 130 may have a female connector structure or a female socket structure, and the second connector 140 may have a male connector structure or a male socket structure.

In a body 131 of the first connector 130, a female connection part 132 horizontally protrudes, and a terminal connection member 134 is formed inside the female connection part 132. The terminal connection member 134 is connected to a first end of a fixture pin 133, and a second end 138 of the fixture pin 133 passes through a pin hole 112 of the light emitting module 102.

A male connection part 142 is formed in a body 141 of the second connector 140, and the female connection part 132 of the first connector 130 is inserted into the male connection part 142. A connection terminal 144 of a fixture pin 143 protrudes from the central portion of the male connection part 142, and the connection terminal 144 is connected to the terminal connection member 134 of the first connector 130. Accordingly, the first connector 130 is electrically connected to the second connector.

In this case, a second end 148 of the fixture pin 143 of the second connector 140 is bended, and passes through a pin hole 113 of the light emitting module 101.

The second ends 138 and 148 of the fixture pins 133 and 143 comprising passed through the pin holes 112 and 113 of the light emitting modules 101 and 102 may be bonded through a surface mount technology (SMT).

A hook 135 and a hook groove 145 are provided in the bodies 131 and 141 of the first and second connectors 130 and 140, and the hook 135 is locked with the hook groove 145. The connection in the above locking structure is strong against external vibration or the test of external shock.

FIGS. 10 to 13 are views showing modification examples of the light source device 100A of FIG. 7.

Figure 10:
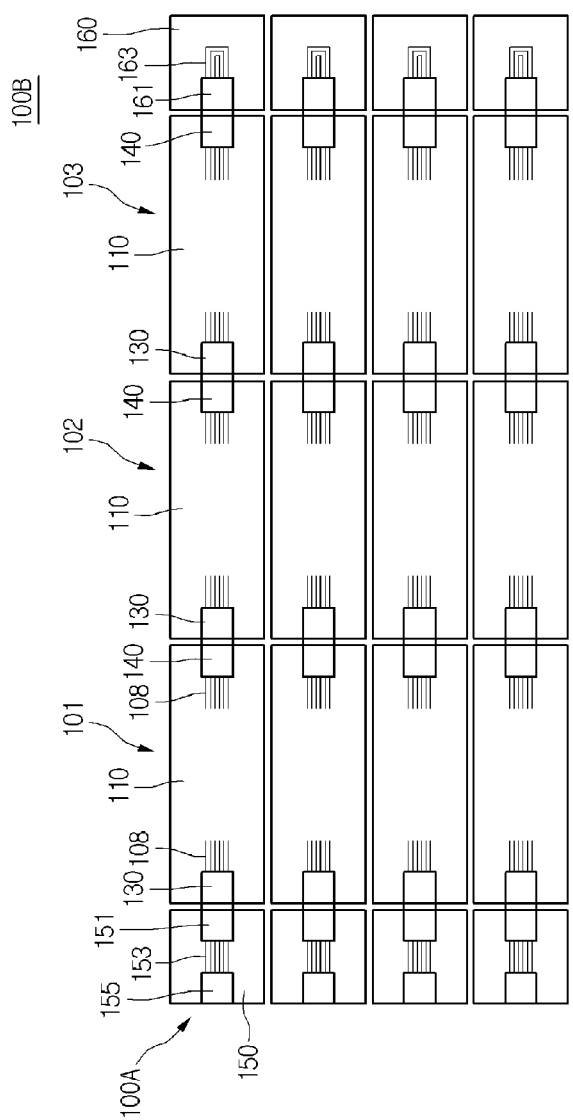
FIGS. 10 to 13 are views showing modification examples of a light source device of FIG. 7.

Referring to FIG. 10, a light source device 100B has a structure in which the light source devices 100A are individually arranged in three rows. The external connection modules 150 are connected to first ends of the plural light emitting modules 101, 102, and 103, and the circuit termination modules 160 are connected to second ends of the light emitting modules 101, 102, and 103.

Figure 11:
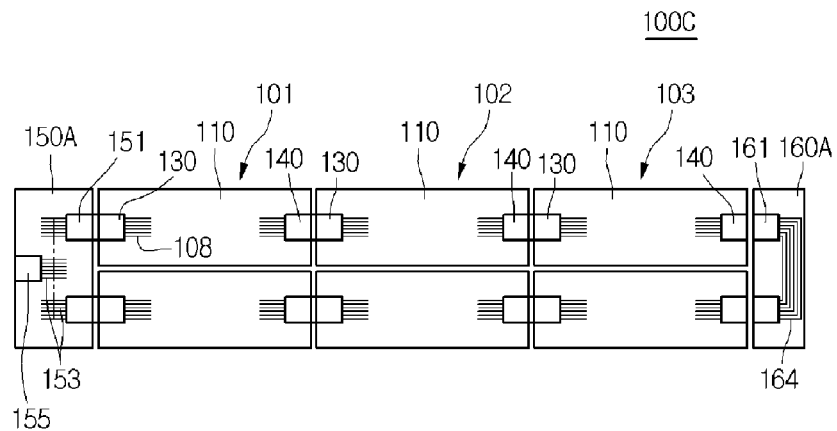

Referring to FIG. 11, a light source device 100C has a structure in which the light emitting modules 101, 102, and 103 provided in two rows are arrayed in series, and a single external connection module 150A and a single circuit termination module 160A are connected at both ends of the array of the light emitting modules.

The external connection module 150A comprises the plural third connectors 151 and the single fifth connector 155. The plural third connectors 151 are connected to the first connectors 130 of the first light emitting modules 101 provided in two rows.

The circuit termination module 160A comprises the plural fourth connectors 161 and a common lead pattern 164. The plural fourth connectors 161 are connected to the second connectors 140 of the third light emitting modules 103, and the common lead pattern 164 provides a closed loop circuit or a feed-back loop circuit to the fourth connector 161.

In this case, the common lead pattern 164 of the circuit termination module 160A may provide a circuit pattern connecting the plural fourth connectors 161 to each other. Such a circuit termination module 160A provides a circuit pattern connecting the arrays of the light emitting modules provided in two rows to each other in series.

Figure 12:
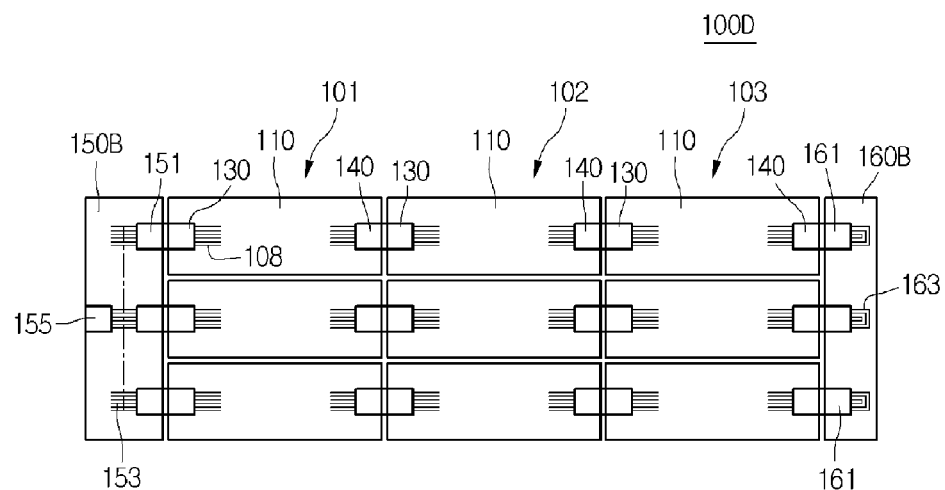

Referring to FIG. 12, a light source device 100D comprises the light emitting modules 101, 102, and 103 arrayed in three rows, an external connection module 150B, and a circuit termination module 160B. The single external connection module 150B is connected to a first end of the first light emitting modules 101 arrayed in three rows, and the circuit termination module 160B is connected to a second end of the third light emitting modules 103 arrayed in three rows.

Figure 13:
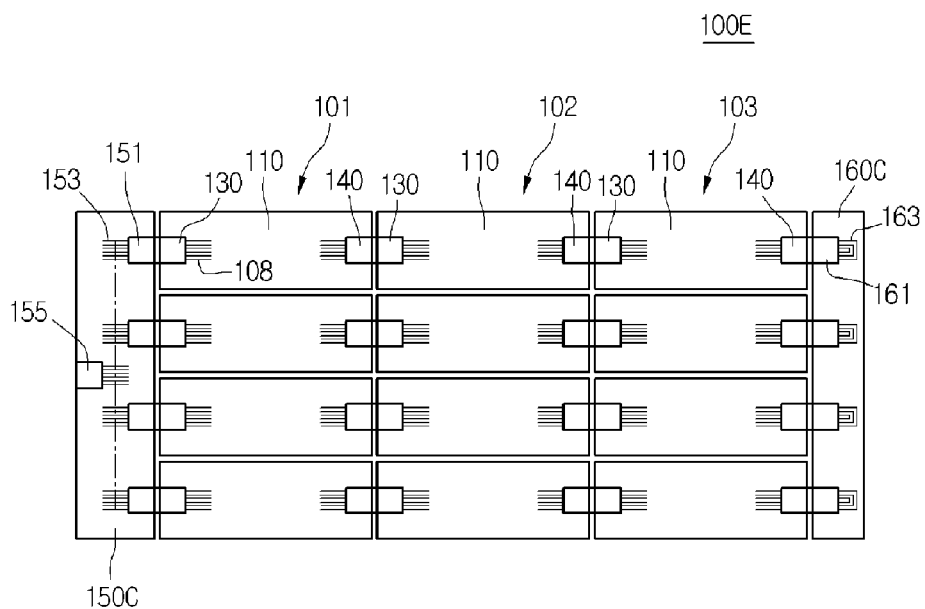

Referring to FIG. 13, the source device 100E comprises the plural light emitting modules 101, 102, and 103 arrayed in four rows, an external connection module 150C, and a circuit termination module 160C. The single external connection module 150C is connected to a first end of the first light emitting modules 101 arrayed in four rows, and the circuit termination module 160C is connected to a second end of the third light emitting modules 103 arrayed in four rows. In this case, the array of the light emitting modules has a structure in which the plural light emitting modules are horizontally or vertically connected to each other, and is formed in at least one row.

Referring to FIGS. 11 to 13, the single external connection module and circuit termination module are connected to both ends of the M light emitting modules arrayed in N rows, so that the light source device can be conveniently manufactured through the simple connection module.

Figure 14:
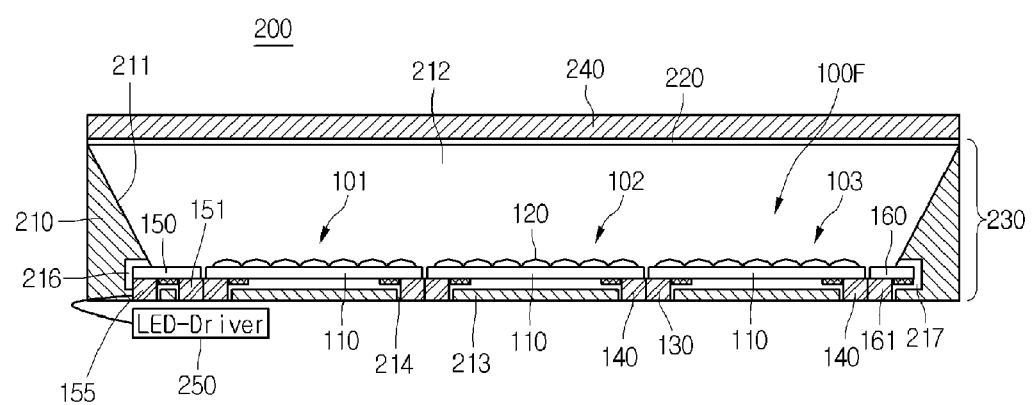
FIG. 14 is a sectional view showing a display device employing a light source device of FIG. 7.

FIG. 14 is a sectional view showing a display device 200 employing the light source device according to the embodiment. Such a display device 200 can use at least one of the light source devices shown in FIGS. 10 to 13, and the embodiment is not limited to the number of the columns or the rows of the light emitting modules.

Referring to FIG. 14, the display device comprises a backlight unit 230 and a display panel 240.

The backlight unit 230 comprises a light source device 100F, a bottom cover 210, and an optical sheet 220. The light source device 100F has a structure in which the plural light emitting modules 101, 102, and 103 are arrayed in at least one row.

The bottom cover 210 has a container shape and comprises metal. The bottom cover 210 is provided at an inside 212 thereof with the light source device 100F. An inner side surface 211 is inclined in order to reflect light. The shape or the material of the bottom cover 210 may be changed.

A plurality of connector grooves 214 are formed in a base 213 of the bottom cover 210, and the light emitting modules 101, 102, and 103, the external connection module 150, the circuit termination module 160, and the first to fifth connectors 130, 140, 151, 161, and 155 can be received by using the connector grooves 214.

The connectors 130, 140, 151, 161, and 155 are inserted into the connector grooves 214, so that the height of the light source device 100F can be lowered in the bottom cover 210. In addition, the heat emitted from the light emitting modules 101, 102, and 103 can be discharged through the connector grooves 214.

Module receiving grooves 216 and 217 are formed at first and second sides of the bottom cover 210, and the external connection module 150 and the circuit termination module 160 are partially or entirely in the module receiving grooves 216 and 217.

As shown in FIG. 2, the light emitting modules 101, 102, and 103 can be coupled to the bottom cover 210 by using a screw through a screw hole.

An LED driver 250 is connected to the fifth connector 155 of the external connection module 150, so that the LED chips according to colors or all LED chips may be driven in the light emitting devices 120 of the light source device 100F.

The optical sheet 220 may be provided on a substrate 110 of the light source device 100F, and the optical sheet 220 comprises at least one of a diffusion sheet and a prism sheet. The diffusion sheet diffuses incident light, and the prism sheet concentrates incident light on a display area. In addition, the optical sheet 220 further comprises an illumination enhancement film.

A reflective sheet (not shown) may be provided on the substrate 110 of the light source device 100F. The reflective sheet (not shown) is formed with a plurality of device holes, so that the light emitting devices 120 may be inserted or may protrude through the device hole. Accordingly, light generated from the light emitting device 120 of the light emitting modules 101, 102, and 103 is irradiated toward a display panel, and the reflected light is reflected by the reflective sheet again.

The display panel 240 comprises a liquid crystal panel, and two transparent substrates (not shown) and a liquid crystal (not shown). The display panel 240 can display information by using transmitted light and driving a liquid crystal. The embodiment is not limited to the display panel 240, and can employ various display panels.

Such a display panel 200 has a connector type and the plural light emitting modules 101, 102, and 103 provided in at least one row, so that the connection using the first to fourth connectors 130, 140, 151, and 161 is conveniently achieved. In addition, the display panel 200 is strong against an external shock, and has a superior heat discharging characteristic. Further, the display device 200 can simply control the driving of the light emitting devices by using a driver.

Such a backlight unit 230 can be used for a portable terminal, a monitor, a broadcasting receiving apparatus, an indication device, and an illumination device.

Accordingly, although embodiments of the present invention are described in detail, it must be noted that the embodiments are for the purpose of only description, but not the limitation thereof. In addition, those skilled in the art will appreciate that various modifications, additions and substitutions are possible, without departing from the scope and spirit of the invention.

INDUSTRIAL APPLICABILITY

According to the embodiments, modules of a light source device are connected to each other by using connectors, so that the modules can be stably connected.

According to the embodiments, connectors are provided at the bottom surface of a light emitting module, so that space utilization can be improved at the top surface of the light emitting module.

According to the embodiments, modules are connected to each other by using connectors comprising a hook structure, so that the connection force between the modules is improved. Accordingly, the connection between the modules is strong against vibration or shock.

According to the embodiments, light emitting modules provided in at least one row are connected to a circuit termination module by using a connector, so that there is no need to form an additional pattern on the other end of the light emitting module.

According to the embodiments, light emitting modules provided in at least one row are connected to an external connection module by using a connector, so that there is no need to form an additional pattern on one end of the light emitting module.

According to the embodiments, auxiliary modules are provided at both sides of the light emitting module, so that light emitting modules having the same type can be used. Accordingly, the light emitting module can be conveniently manufactured.

According to the embodiments, a light emitting module can be easily replaced with new one.

The invention claimed is:

1. A light source device, comprising:
a light emitting module comprising a light emitting device and first and second pin holes;
a circuit termination module provided at a second end of the light emitting module and including a fourth pin hole;
first and second connectors connected to a first end and the second end of the light emitting module through the first and second pin holes, respectively; and
a fourth connector connected to the circuit termination module through the fourth pin hole, and connected to the second connector of the light emitting module,
wherein the first and second pin holes pass through the light emitting module from a bottom surface of the light emitting module to a top surface of the light emitting module, and
wherein the fourth connector is disposed on a bottom surface of the circuit termination module.

2. The light source device as claimed in claim 1, further comprising:
an external connection module provided at the first end of the light emitting module and including a third pin hole; and
a third connector connected to a second end of the external connection module through the third pin hole, and connected to the first connector of the light emitting module.

3. The light source device as claimed in claim 2,
wherein the first and fourth connectors each comprise a female connector, and the second and third connectors each comprise a male connector.

4. The light source device as claimed in claim 2, wherein the first and second connectors have first and second fixture pins, respectively, connected to the light emitting module through the first and second pin holes, respectively, the fourth connector has a fourth fixture pin connected to the circuit termination module through the fourth pin hole, and the third connector has a third fixture pin connected to the external connection module through the third pin hole.

5. The light source device as claimed in claim 4, wherein the first to fourth fixture pins each has an electrical conductivity.

6. The light source device as claimed in claim 2, wherein the first and second connectors are connected to the bottom surface of the light emitting module, and the third connector is connected to a bottom surface of the external connection module.

7. The light source device as claimed in claim 2, wherein the light emitting module and the external connection module comprises a lead pattern connected via the first through third connectors.

8. The light source device as claimed in claim 2,
wherein the light emitting module includes a plurality of the light emitting modules having respective first and second pin holes, the plurality of light emitting modules being horizontally and/or vertically provided, and
wherein the plurality of light emitting modules are connected to each other via the respective first and second connectors.

9. The light source device as claimed in claim 2,
wherein the light emitting device includes a plurality of the light emitting modules that are provided in at least two rows, and
wherein the external connection module is connected to corresponding first ends of the plurality of light emitting modules provided in the at least two rows.

10. The light source device as claimed in claim 9, wherein the circuit termination module is connected to corresponding second ends of the plurality of light emitting modules provided in at least two rows.

11. The light source device as claimed in claim 1, wherein the circuit termination module comprises a lead pattern which connects a terminal circuit of the light emitting module in a closed loop or a feed-back loop.

12. The light source device as claimed in claim 1, wherein the light emitting device comprises at least one of a red LED chip, a green LED chip, a blue LED chip, a yellow LED chip, and an UV LED chip.

13. A light source device, comprising:
a light emitting module array, in which light emitting modules are provided in a plurality of rows,
wherein each of the light emitting modules includes a respective light emitting device and respective first and second pin holes;
a circuit termination module provided at a second end of the light emitting module array and including a plurality of fourth pin holes;
first and second connectors respectively connected to first and second end portions of each of the light emitting modules through the first and second pin holes, in which the first and second connectors connect adjacent ones of the light emitting modules provided in the plurality of rows to form the light emitting module array; and
a plurality of fourth connectors connected to the circuit termination module through the plurality of fourth pin holes, in which each of the plurality of fourth connectors is connected to a corresponding second connector of a final light emitting module of each of the plurality of rows,
wherein the respective first and second pin holes pass through the light emitting modules from a bottom surface to a top surface, and wherein the plurality of fourth connectors are disposed on a bottom surface of the circuit termination module.

14. The light source device as claimed in claim 13, further comprising:
an external connection module provided at a first end of the light emitting module array and comprising a plurality of third pin holes; and
a plurality of third connectors connected to a second end of the external connection module through the plurality of third pin holes, in which each of the plurality of third connectors is connected to a corresponding first connector of a first light emitting module of each of the plurality of rows.

15. The light source device as claimed in claim 14,
wherein the first and second connectors are provided at the bottom surface of a corresponding light emitting module and the plurality of third connectors is connected to a bottom surface of the external connection module, and
wherein each of the first and the plurality of fourth connectors comprise a female connector and each of the second connectors and the plurality of third connectors comprise a male connector.

16. The light source device as claimed in claim 14, wherein the light source device comprises a fifth connector connected to a first end of the external connection module, the fifth connector configured to be connected to a device driver.

17. The light source device as claimed in claim 13, wherein the circuit termination module comprises a common lead pattern connecting terminals of the plurality of fourth connectors to each other.

18. A display device, comprising:
a plurality of light emitting modules, each of the plurality of light emitting modules comprising a light emitting device, a first pin hole at a first end of the respective light emitting module and a second pin hole at a second end of the respective light emitting module;
a bottom cover below the plurality of light emitting modules;
an external connection module provided at a first end of the plurality of light emitting modules and comprising a plurality of third pin holes;
a circuit termination module provided at a second end of the plurality of light emitting modules and comprising a fourth pin hole;
first and second connectors electrically connected to the respective first and second ends of each of the plurality of light emitting modules through the corresponding first and second pin holes, in which the first and second connectors connect the plurality of light emitting modules to each other; and
a fourth connector connected to the circuit termination module through the fourth pin hole, and connected to one of the second connectors corresponding to a last of the plurality of light emitting modules,
wherein the first pin hole and the second pin hole pass from a bottom surface to a top surface of the corresponding light emitting module, and
wherein the fourth connector is disposed on a bottom surface of the circuit termination module.

19. The display device as claimed in claim 18, further comprising:
a third connector connected to a second end of the external connection module through the plurality of third pin holes, and connected to one of the first connectors corresponding to a first of the plurality of light emitting modules.

20. The display device as claimed in claim 19,
wherein the bottom cover comprises a connector groove which receives the first and second connectors.

21. The display device as claimed in claim 18, further comprising:
an optical sheet provided over the plurality of light emitting modules; and
a display panel provided over the optical sheet.

* * * * *